(12) United States Patent
Cairo et al.

(10) Patent No.: US 7,796,376 B2
(45) Date of Patent: Sep. 14, 2010

(54) ELECTRICAL ENCLOSURE COOLING STRUCTURE ASSEMBLY AND METHOD

(75) Inventors: John Alan Cairo, Kenosha, WI (US); Tyler Fleig, Lake Mills, WI (US); Bruce Carl Nemec, Madison, WI (US)

(73) Assignee: Yaskawa America, Inc., Waukegan, IL (US)

( * ) Notice: Subject to any disclaimer, the term of this patent is extended or adjusted under 35 U.S.C. 154(b) by 177 days.

(21) Appl. No.: 12/009,299

(22) Filed: Jan. 17, 2008

(65) Prior Publication Data

US 2009/0185346 A1    Jul. 23, 2009

(51) Int. Cl.
H05K 7/20 (2006.01)
H05K 5/00 (2006.01)

(52) U.S. Cl. .................. 361/678; 361/676; 361/679.49; 361/679.51; 361/690; 361/692; 165/53; 220/580; 220/747; 220/810; 454/184; 454/195

(58) Field of Classification Search ......... 361/676–678, 361/690, 692, 694–695; 165/53–57; 220/336.1, 220/580, 747, 785, 796, 810, 845; 312/223.1, 312/236; 454/184, 195, 277, 284
See application file for complete search history.

(56) References Cited

U.S. PATENT DOCUMENTS

| | | | |
|---|---|---|---|
| 1,843,918 A * | 2/1932 | Cornell | 220/366.1 |
| 5,801,331 A * | 9/1998 | Zachrai | 174/541 |
| 5,863,309 A * | 1/1999 | Louis et al. | 55/368 |
| 5,957,555 A * | 9/1999 | Kohler et al. | 312/100 |
| 6,067,223 A * | 5/2000 | Diebel et al. | 361/676 |
| 6,201,700 B1 | 3/2001 | Tzinares et al. | |
| 6,628,521 B2 | 9/2003 | Gustine et al. | |
| 6,749,498 B2 * | 6/2004 | Pfister | 454/184 |
| 6,979,772 B2 | 12/2005 | Meng-Cheng et al. | |
| 6,983,566 B2 * | 1/2006 | Laun et al. | 49/507 |
| 2009/0015120 A1 * | 1/2009 | Newhouse et al. | 312/236 |

* cited by examiner

*Primary Examiner*—Jayprakash N Gandhi
*Assistant Examiner*—Robert J Hoffberg
(74) *Attorney, Agent, or Firm*—Wood, Phillips, Katz, Clark & Mortimer (57) ABSTRACT

An electrical enclosure assembly comprises an enclosure having walls defining an interior space for housing electrical components and having a front flange surrounding a front opening. A cover is hingedly mounted to the enclosure for selectively closing the front opening. The cover comprises a front wall larger than the front opening and a rearwardly extending peripheral rim. Cooling structure is integrally formed on an interior surface of the cover proximate the peripheral rim. The cooling structure comprises a plurality of spaced apart cooling ribs each having a shoulder engaging the enclosure front flange when the cover is in a closed position to provide an air flow path between the interior space and outside of the enclosure through spaces between the cooling ribs.

15 Claims, 9 Drawing Sheets

ELECTRICAL ENCLOSURE COOLING STRUCTURE ASSEMBLY AND METHOD

CROSS REFERENCE TO RELATED APPLICATIONS

There are no related applications.

FIELD OF THE INVENTION

This invention relates generally to boxes and housings intended for enclosing electrical components, and, more particularly to a cooling structure in an electrical enclosure assembly.

BACKGROUND OF THE INVENTION

Electrical components used for industrial, commercial, or residential applications require enclosures to meet applicable code requirements, improve safety by preventing insertion of foreign objects, and slow deterioration of the components caused by dust, oils, and other elements. Electrical enclosures must be designed to provide the necessary protection for the environment surrounding the panel, while minimizing occupied space to meet dimensional constraints and reduce manufacturing costs.

As devices built from power semiconductor technology, such as insulated gate bipolar transistors (IGBTs) and silicon-controlled rectifiers (SCRs) have decreased in cost and improved in reliability, devices such as variable frequency drives (VFDs), motor soft starters, and other power conversion equipment are more commonly used to control motors. One of the biggest challenges in designing electrical enclosures for power conversion equipment is providing a means for heat dissipation. Semiconductor devices produce heat from switching losses and parasitic impedances inherent in their manufacturing. Other required devices, such as reactors and filters introduce voltage drops in the circuit and dissipate the energy as heat.

Electrical enclosures for power conversion equipment sometimes utilize forced convection from strategically located fans or other blower units to solve heating problems and maintain safe operating temperatures. While forced convection techniques provide effective cooling, the added components increase manufacturing costs, and create additional maintenance expenses as fans have a limited life expectancy. Consequently, natural convection cooling is often utilized when possible. Effective cooling with natural convection requires proper mechanical design to ensure adequate airflow and heat exchange.

Figure 1:
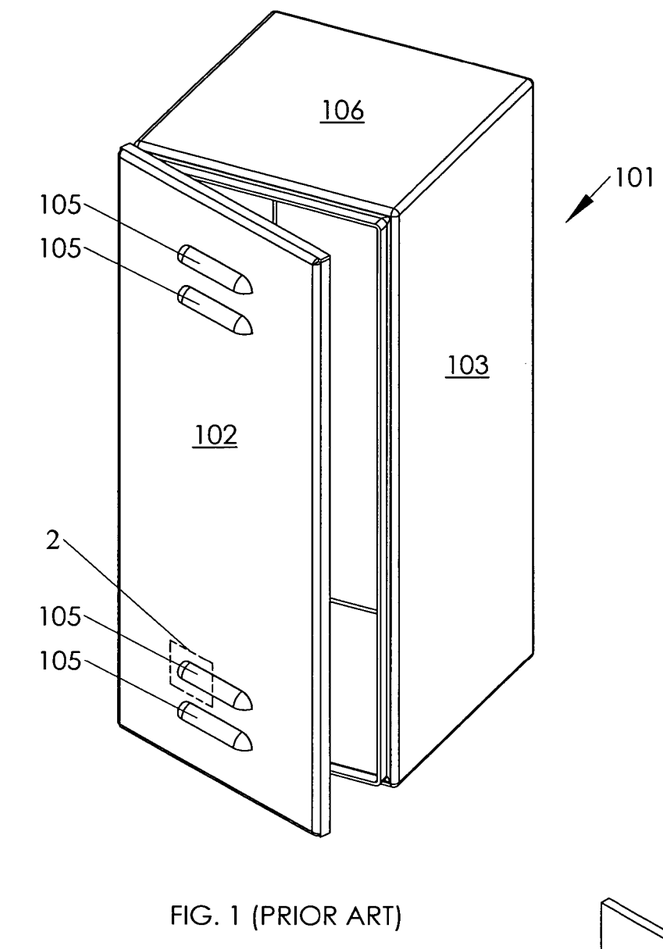
FIG. 1 is a front perspective view of a prior art electrical enclosure assembly.
Figure 2:
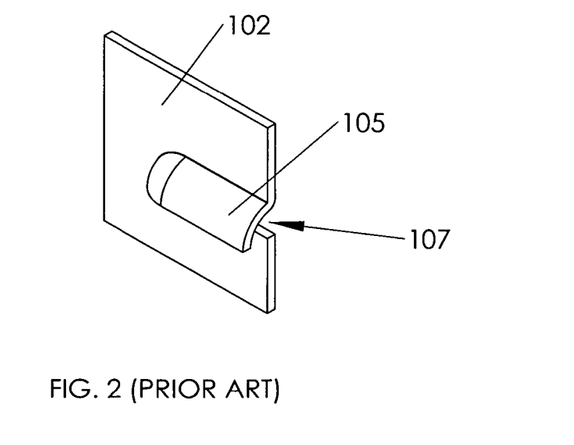
FIG. 2 is a detail view of the louver enclosed within portion 2 as shown in FIG. 1.

FIG. 1 illustrates a common electrical enclosure assembly 101 with a cover 102 fastened to the sides 103 of the assembly 101. The cover 102 of the enclosure assembly 101 contains louvers 105, which are a series of narrow ventilation openings with overlapping slats. It is common practice in the art to form such louvers 105 in order to permit heat exchange, while providing a degree of protection against falling dust particles and entry of other foreign material. Common design practice includes louvers in both the bottom and top portions of the cover for intake of cooler ambient air and discharge of warmer interior air, respectively, along the plane. The flat top surface 106 of the enclosure assembly 101 typically will not contain ventilation openings. FIG. 2 shows an exploded view of the louver 105 contained within the bracket (2 in FIG. 1).

The louvers 105 allow for the entry of fresh, cooler air into the front of the enclosure's interior 107, lowering the temperature of the air in contact with electrical components contained within the enclosure assembly 101. The temperature of this air contained within the enclosure assembly 101 and in contact with components contained therein is commonly referred to in the art as the internal ambient temperature.

Figure 3:
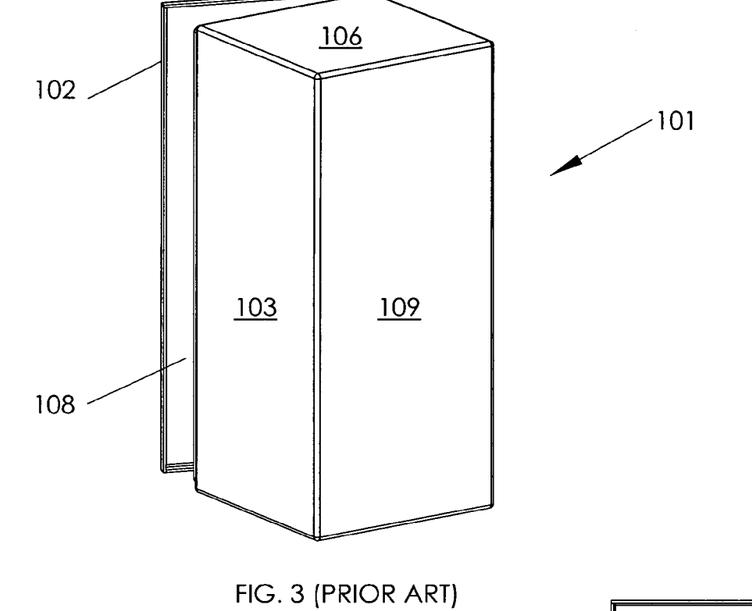
FIG. 3 is a rear perspective view of the prior art electrical enclosure assembly.

FIG. 3 illustrates a rear view of the enclosure assembly 101. In this depiction, the cover 102 is partially open. The inner side surface 108 forms an abutment surface with the right side surface 103 of the enclosure assembly 101. Electrical components (not shown) are mounted on the interior of the back panel 109.

Figure 4:
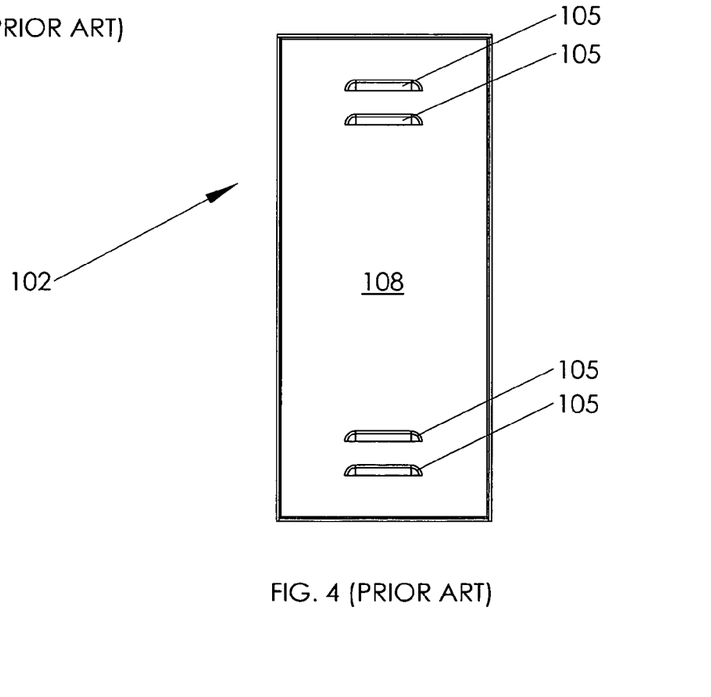
FIG. 4 is a rear perspective view of the cover of the prior art electrical enclosure assembly.

FIG. 4 illustrates the rear view of the cover 102, including the inner side surface 108 with the louvers 105.

Another common design practice is to increase the enclosure assembly dimensions to increase surface area. One well-known technique of increasing surface area is to include fins on the enclosure cover or sides, as disclosed in U.S. Pat. Nos. 6,201,700; 6,628,521; and 6,979,772. This design practice often increases the overall quantity of material required for manufacture, while reducing the increases in overall dimensions. Those skilled in the art will recognize that a larger surface area, achieved by the addition of fins or expanded height, width, or depth dimensions of the enclosure, increases the amount of its radiated heat energy. This increase in heat energy radiated from the enclosure increases the overall heat dissipation of the enclosure, and therefore, lowers the internal ambient temperature.

One skilled in the art will recognize that the steady-state temperature of electrical components at rated operating conditions can be determined by adding the component temperature rise at rated conditions to the ambient temperature. In the case of components mounted within an electrical enclosure assembly, the internal ambient temperature, rather than the temperature of the air outside the enclosure, determines the component steady-state operating temperature. Therefore, the enclosure design has a critical influence on the steady-state operating temperature of all components contained within the enclosure assembly.

Each of these design practices utilized in prior art decrease the internal ambient temperature and improves cooling of components, but they also have disadvantages. Louvers are difficult and costly to manufacture. In the case of a metal enclosure, the manufacturing method would need to include a stamping process. With polymer enclosures, the molding process becomes more difficult, or an additional milling step is required. With both enclosure types, manufacturing costs increase and production rates decrease. Louvers also do not provide complete protection against insertion of foreign objects into the enclosure assembly. For this reason, a separate screen or filter is often required behind the louvers on the inside of the cover. Adding fins to the cover or sides also increases the quantity of material required, and makes the installation of a control panel or conduit entry points on the enclosure very difficult, driving up overall manufacturing and installation costs. Increasing dimensions of the enclosure assembly increases manufacturing costs, as more material is required, and also requires more space for mounting. As the cost of real estate increases, commercial and residential builders seek to maximize useable office and living space, while minimizing the space occupied by plumbing and control rooms. Reducing the dimensions of electrical enclosure assemblies allows for less occupied wall or floor space and, therefore, smaller electrical control rooms in commercial and residential buildings. Eliminating the need for louvers or fins reduces the quantity of material required, decreases costs, and improves manufacturing efficiency.

The present invention is directed to improvements in cooling of electrical enclosure assemblies.

SUMMARY OF THE INVENTION

In accordance with the invention, there is provided an electrical enclosure assembly including a cooling structure integrated in the cover.

Broadly, there is disclosed herein an electrical enclosure assembly comprising an enclosure having walls defining an interior space for housing electrical components and having a front flange surrounding a front opening. A cover is hingedly mounted to the enclosure for selectively closing the front opening. The cover comprises a front wall larger than the front opening and a rearwardly extending peripheral rim. Cooling structure is integrally formed on an interior surface of the cover proximate the peripheral rim. The cooling structure comprises a plurality of spaced apart cooling ribs each having a shoulder engaging the enclosure front flange when the cover is in a closed position to provide a tortuous air flow path between the interior space and outside of the enclosure through spaces between the cooling ribs that permit air flow while prohibiting direct access by fingers or foreign objects.

In accordance with another aspect of the invention, there is provided a method for manufacturing an electrical enclosure assembly comprising the steps of: providing an enclosure having walls defining an interior space for housing electrical components and having a front flange surrounding a front opening; forming a cover comprising a front wall larger than the front opening and a rearwardly extending peripheral rim including a top rim and two side rims; forming a cooling structure on the interior surface of said cover, said cooling structure comprising a plurality of spaced apart cooling ribs each having a shoulder; and mounting said cover to said enclosure with said cooling rib shoulders engaging the enclosure front flange when the cover is in a closed position to provide a tortuous air flow path between said interior space and outside of the enclosure through spaces between the cooling ribs that permit air flow while prohibiting direct access by fingers or foreign objects.

Further features and advantages of the invention will be readily apparent from the specification and from the drawings.

DETAILED DESCRIPTION OF THE INVENTION

In the following detailed description, specific details are disclosed to allow for a thorough understanding of the invention. It will be apparent to one skilled in the art that the invention may be practiced without these specific details. In some cases, well known features have not been described in detail to avoid obscuring the invention.

Figures 5, 6:
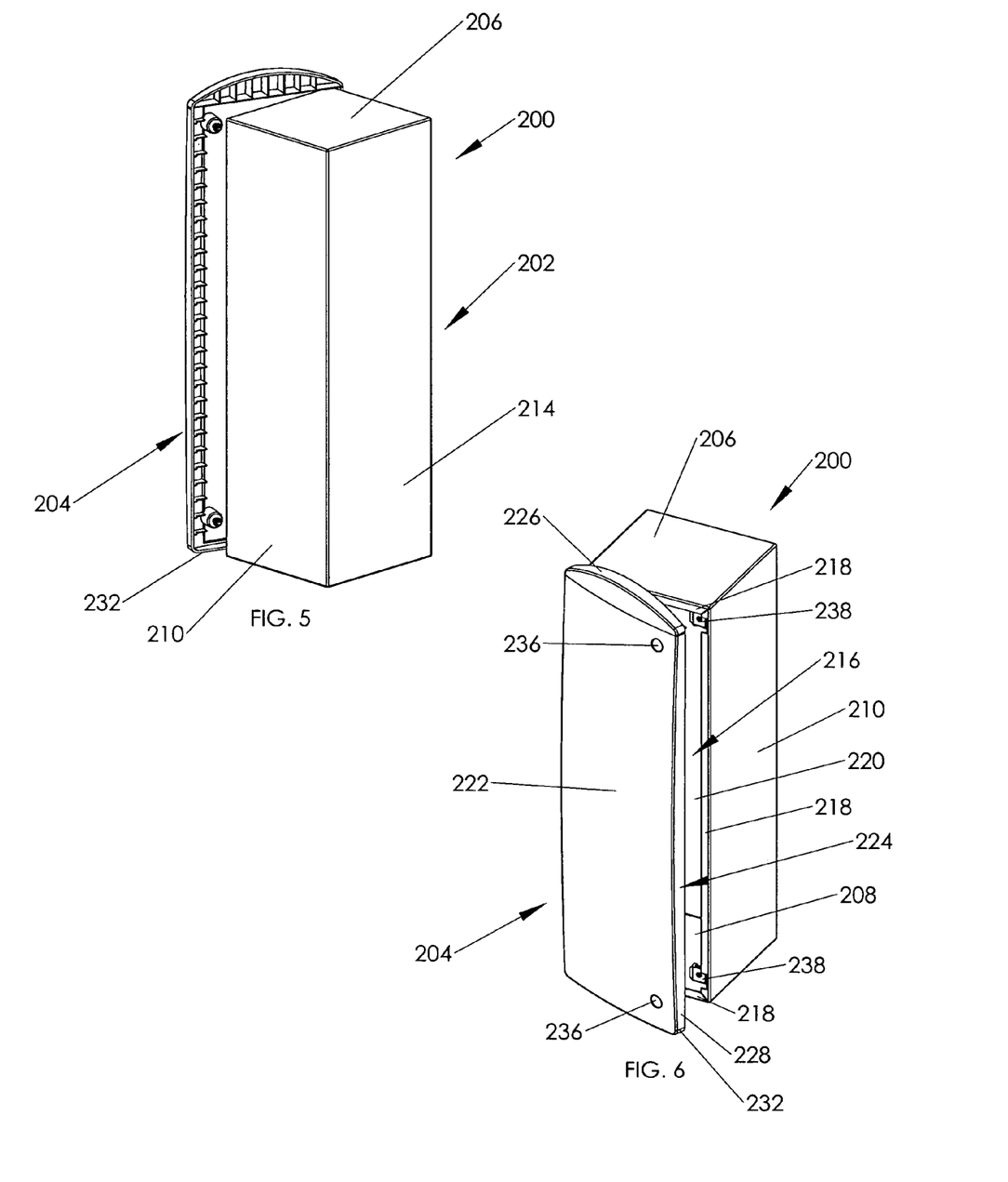
FIG. 5 is a left rear perspective view of an electrical enclosure assembly in accordance with the present invention.
FIG. 6 is a front perspective view of the electrical enclosure assembly of FIG. 5.
Figure 7:
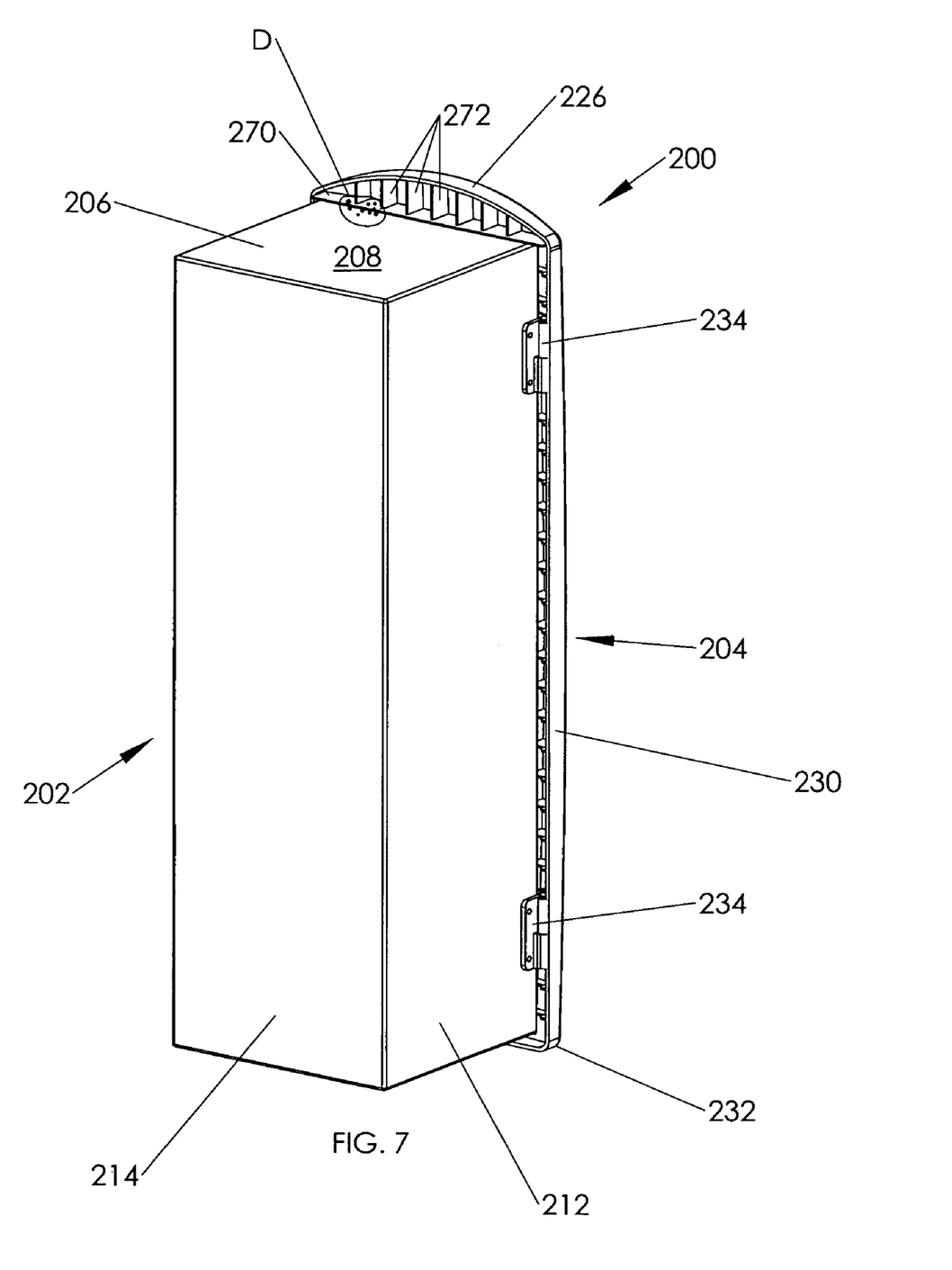
FIG. 7 is a right rear perspective view of the electrical enclosure assembly of FIG. 5.

Referring initially to FIGS. 5, 6 and 7, an electrical enclosure assembly 200 in accordance with the invention is illustrated. The electrical enclosure assembly 200 comprises a housing or enclosure 202 and a cover 204. The cover 204 includes cooling structure in accordance with the invention integrally formed thereon, as described below.

The enclosure 202 is of a parallelepiped configuration including a top wall 206, a bottom wall 208, opposite side walls 210 and 212, and a rear wall 214 defining an interior space 216. Front edges of the top wall 206, bottom wall 208 and side walls 210 and 212 are turned inwardly to form a front flange 218 surrounding a front opening 220. The interior space 216 is intended for housing electrical components (not shown), such as discussed above in the background of the invention, which are typically fastened to the rear wall 214. As will be apparent, the enclosure may house other components where cooling of interior ambient air is desired.

The enclosure 202 may be formed from any material that can provide a rigid mounting surface for securely fastening and shielding electrical components. Examples of low-cost materials that meet these requirements include aluminum, stainless steel, galvanized steel, steel, or alloy steel. These materials can be painted or plated to provide rust and corrosion resistance if required. The enclosure may be constructed of uniform composition and thickness, or varying thickness, and material composition can be selected for the walls as appropriate, depending on the weight and mounting location of the electrical components.

The cover 204 selectively closes the front opening 220. The cover 204 comprises a front wall 222 larger than the front opening 220. Edges of the cover 204 are turned rearwardly to provide a peripheral rim 224. Particularly, the peripheral rim 224 includes a top rim 226 opposite side rims 228 and 230 and a bottom rim 232, see also FIG. 8. Hinges 234 hingedly fasten the cover 204 to the enclosure side wall 212, see FIG. 7. Latch screws 236 are receivable in brackets 238, see FIG. 6, to provide for closure of the cover 204 to the enclosure 202 while permitting entry for the purpose of electrical component installation or maintenance.

Figure 8:
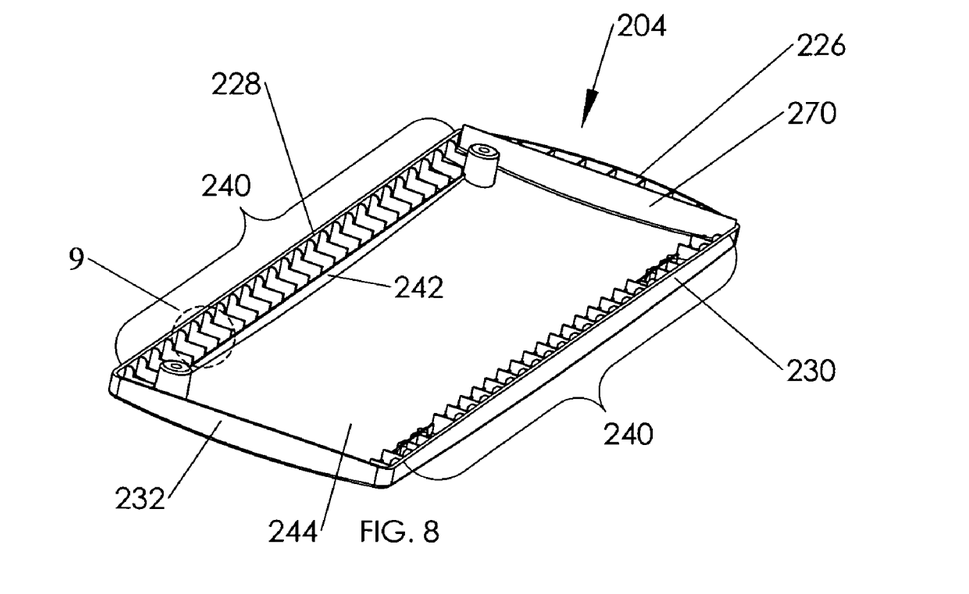
FIG. 8 is a rear perspective view of the cover of the electrical enclosure assembly of FIG. 5.
Figure 9:
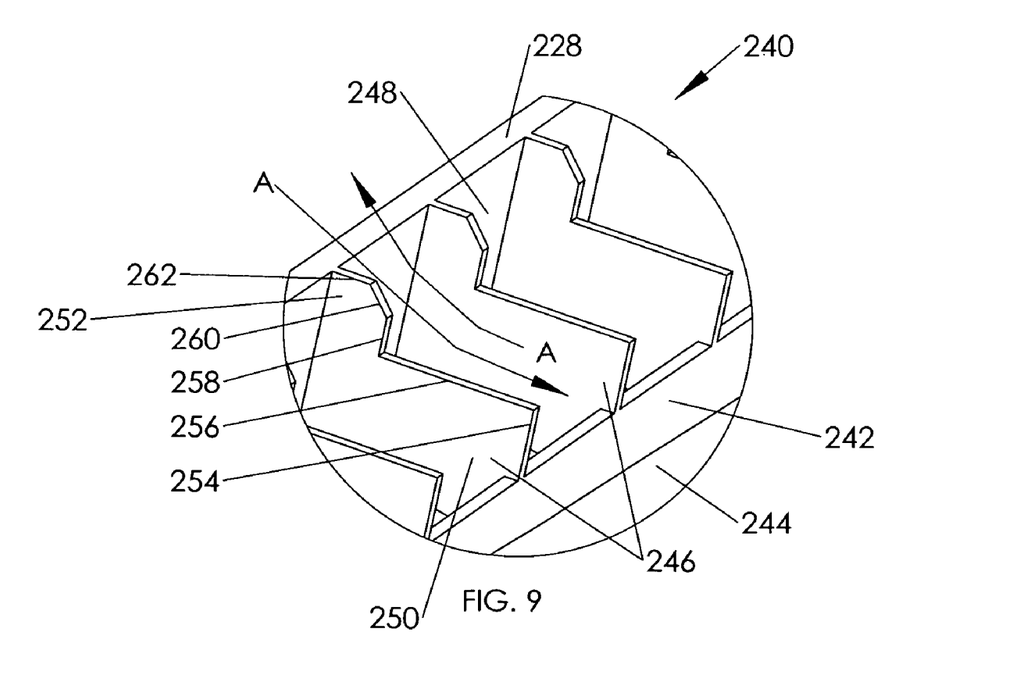
FIG. 9 is a detail view of the cooling structure enclosed within portion 9 as shown in FIG. 8.
Figure 10:
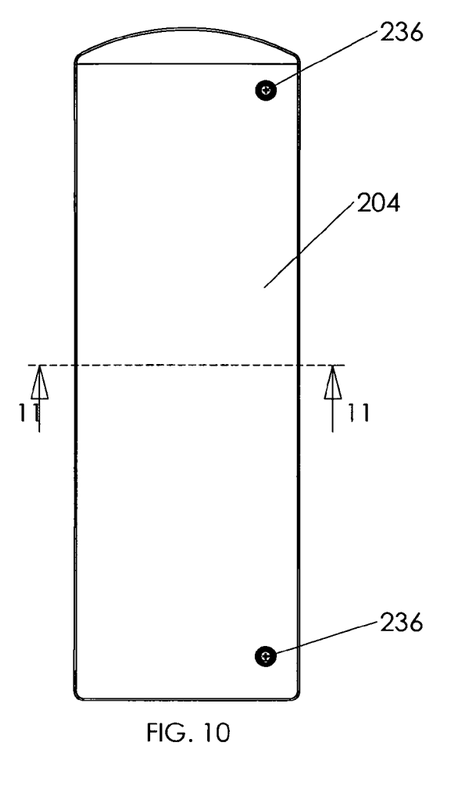
FIG. 10 is a front view of the cover of the embodiment of FIG. 5.

Referring to FIGS. 8 and 9, the door 204 includes cooling structure 240 in accordance with the invention. The cooling structure 240 is located at each side of the front wall 222 along the side rims 228 and 230. Only the cooling structure 240 along the one side rim 228 is described in detail herein, it being understood that the cooling structure 240 along the other side rim 230 is identical.

The cooling structure 240 comprises a partition wall 242 extending rearwardly from an interior surface 244 of the cover front wall 222. The partition wall 242 is parallel to the side rim 228 and is of a shorter height. The cooling structure 240 further comprises a plurality of spaced apart cooling ribs 246 integrally formed on the interior surface 244 between the partition wall 242 and the side rim 228. A space 248 is provided between each adjacent pair of cooling ribs 246. Each cooling rib 246 is L shaped including a long leg 250 extending between the partition wall 242 and the side rim 248 and a short leg 252 extending rearwardly along the side rim 228. Each cooling rib 246 defines a first edge 254 extending planar with the partition wall 242, a second edge 256, perpendicular to the first edge 254, along the longer leg 250 to define a shoulder, a third edge 258, perpendicular to the second edge 256 and along the shorter leg 252, and connected via a beveled fourth edge 260 to a fifth edge 262. The fifth edge 262 is perpendicular to the third edge 258 and is flush with a rearmost edge of the side rim 228.

In accordance with the invention, the cooling ribs 246 define tortuous air flow paths represented by arrows A in the spaces 248 between adjacent pairs of cooling ribs 246 that permit air flow while prohibiting direct access by fingers, tools and other foreign objects. When applicable, Underwriters Laboratories (UL) and National Electrical Manufacturers Association (NEMA) standards require electrical enclosure assemblies to pass "finger probe" tests and barrier requirements in order to obtain certain ratings. For example, if a UL-listed type 1 rating is desired, then the manufacturer must prove that a finger-shaped object cannot contact accessible energized components and that a thin rod cannot access energized or arcing components within a certain distance from an enclosure that acts as a barrier.

In FIGS. 5 and 6, the door 204 is illustrated in a partially open position. FIGS. 7 and 10-12 and details 12A and 12B, and sectional 12C, illustrate the cover 204 in the closed position. As particularly illustrated in FIG. 12A and FIG. 12B, in the closed position the cooling rib shoulders 256 engage the enclosure front flange 218. This spaces the cover front wall 222 from the front flange 218 and positions the side rim 228 spaced from the enclosure side wall 210 to define the tortuous air flow paths represented by the arrows A which can be from outside the enclosure to the interior space 208, see FIG. 12B, or vice versa, see FIG. 12A, as will be apparent.

Figure 12:
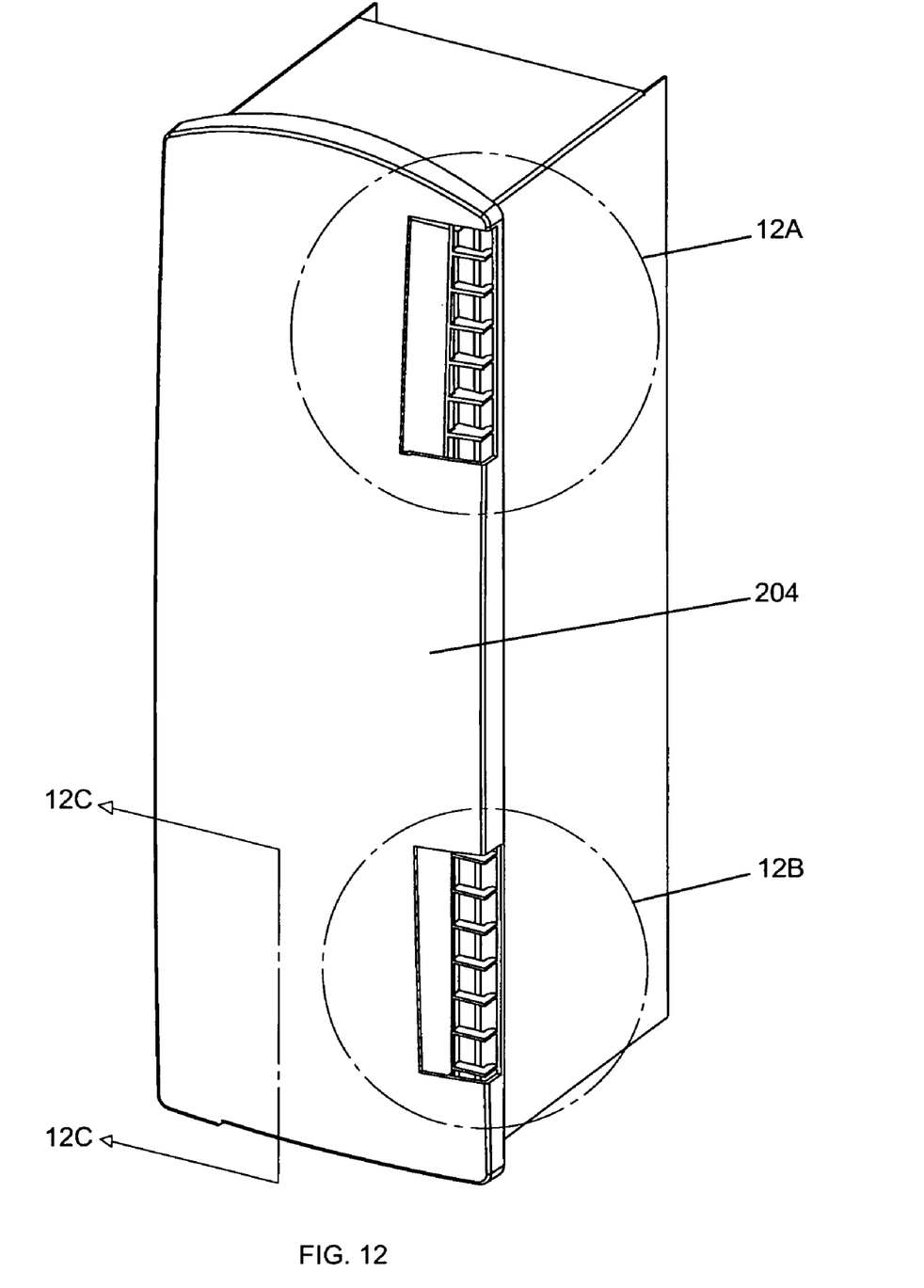
FIG. 12 is a front perspective view of the electrical enclosure assembly of FIG. 5 with parts of the cover cutaway to illustrate the cooling structure in accordance with the invention.
Figure 12A:
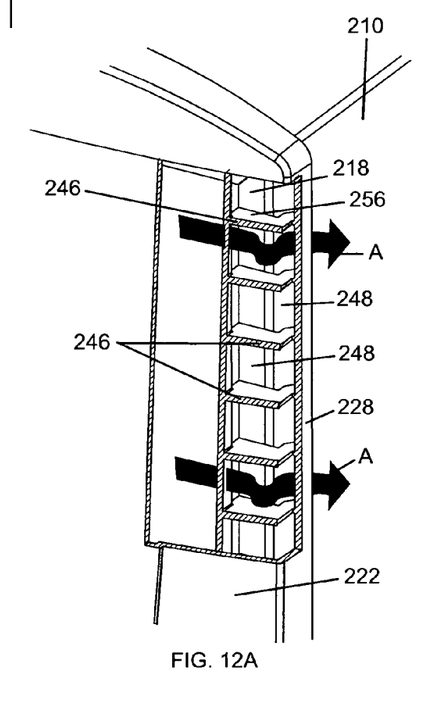
FIG. 12A is a detail view of the cooling structure within portion 12A as shown in FIG. 12.
Figure 12B:
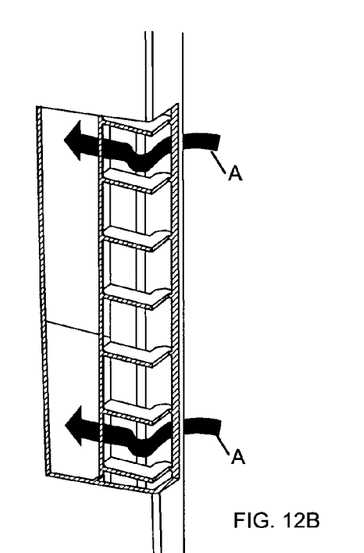
FIG. 12B is a detail view of the cooling structure within portion 12B as shown in FIG. 12.
Figure 12C:
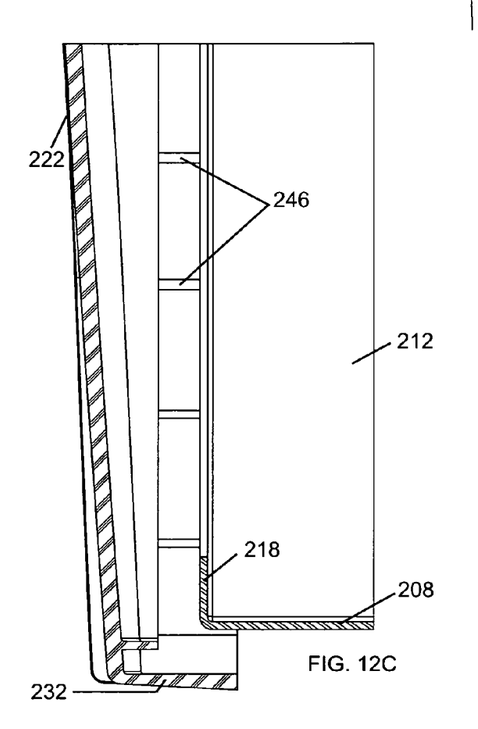
FIG. 12C is a sectional view taken along the line 12C-12C of FIG. 12.

The cooling structure 240 is formed to occupy a total width on the cover interior surface 244 no larger than required to form adequate contact with the enclosure flange 218, in most cases 0.75-1.5 inches. However, other sizes may be needed to form proper contact with the enclosure flange 218, as will be apparent. When the door 204 is closed, the cooling rib third edge 258 contacts the enclosure side wall 210. The first edge 254 forms a junction with the partition wall 242 for structural reinforcement. The beveled edge 260 provides a means to prevent mechanical interference between the cooling ribs 246 and the enclosure side wall 210 and to account for tolerances in the dimensions of the enclosure assembly 200. This geometry of the cooling ribs 246 ensures proper closure of the cover 204 to the enclosure 202.

The cooling ribs 246 are disposed equidistantly from each other along each side of the cover 204 to define the space 248 between the cooling ribs 246. There is no structural contact with the enclosure 202 in the spaces 248 to thus create the tortuous air flow paths A. The path permits both inflow of fresh ambient air, see FIG. 12B, and the escape of hot internal air, see FIG. 12A, thereby creating heat exchange between the interior space 216 and the outside while prohibiting direct access by fingers and other foreign objects.

Figure 11:
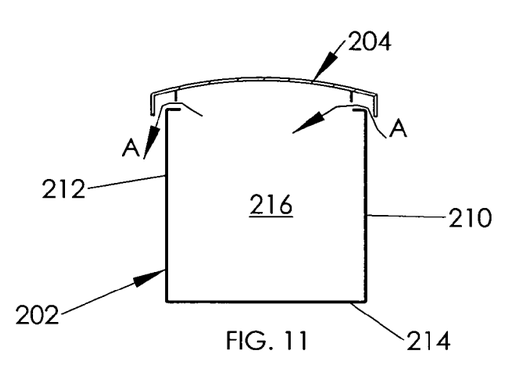
FIG. 11 is a sectional view taken along line 11-11 of FIG. 10.

The geometry of the cooling structure 240 allows for internal air flow in both the plane parallel to the cover and a plane parallel to the enclosure sides 210 and 212 during the heat exchange process, see FIG. 11. This provides an advantage over louvered designs depicted in FIG. 1 which permits air flow only in a plane parallel to the louvered surfaces.

The cover 204 is also provided with means for protecting against vertically falling debris entering the interior space 216. Referring to FIGS. 7 and 8, a protective ledge 270 is formed below the top rim 226. A plurality of vertical support ribs 272 connect the protective ledge 270 to the top rim 226 to provide structural support against falling objects or excessive downward force against the top rim 226. With the cover 204 in the closed position, as shown in FIG. 7, the protective ledge 270 overlies a frontmost part of the top wall 206 to prevent debris D from entering the interior space 216.

In accordance with the invention, the cover 204 may be injection molded of one piece construction. A method of manufacturing the enclosure assembly 200 in accordance with the invention is described relative to FIG. 13.

Figure 13:
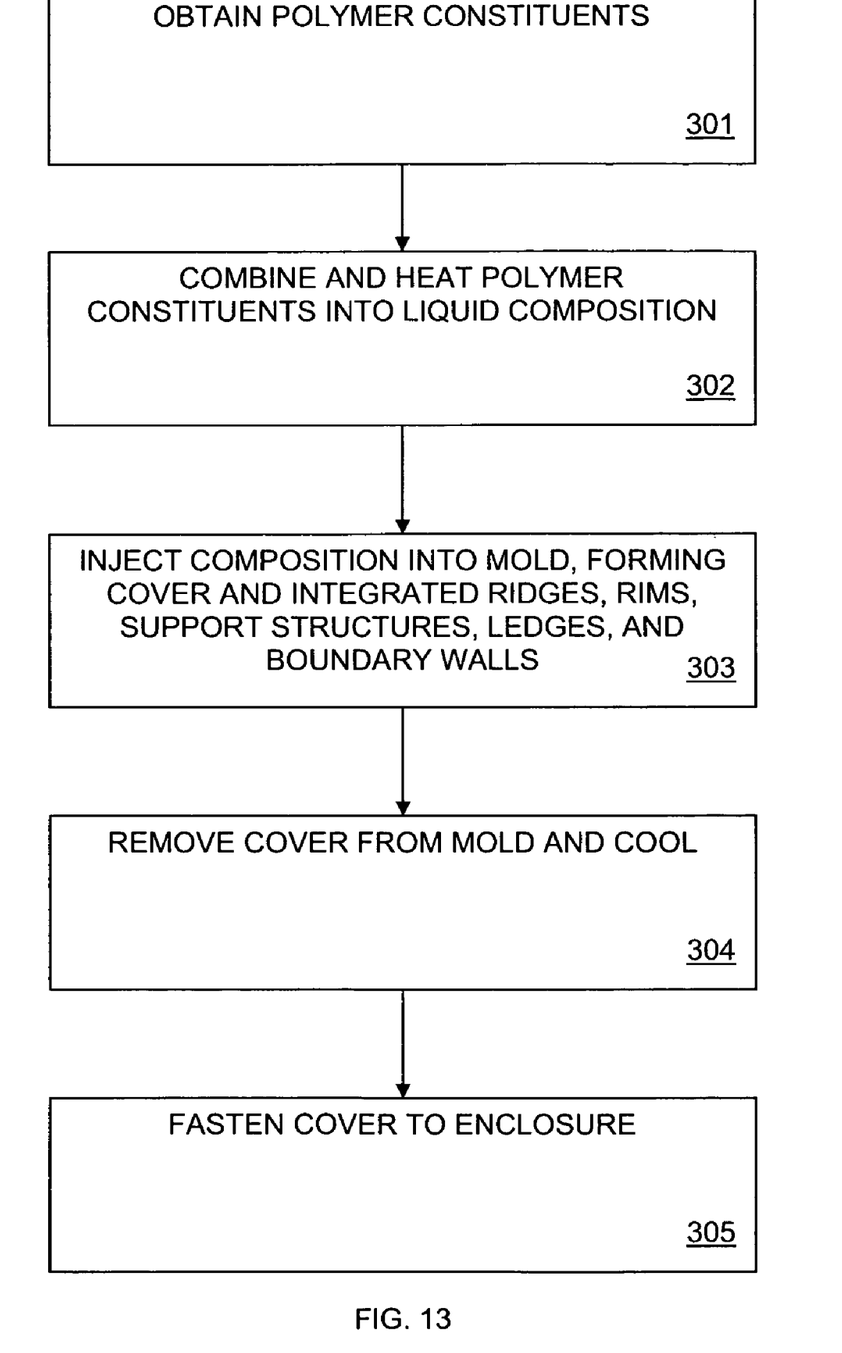
FIG. 13 is a flowchart diagram of a method for manufacturing the electrical enclosure assembly according to the present invention.

A block 301 represents the acquisition of materials for the cover 204. Preferably, all elements of the cover 204 are formed of the same material. Indeed, the cover 204 may be formed of one piece construction. The cover material preferably consists of polymer constituents, most preferably, a polycarbonate-acrylonitrile butadiene styrene (PC-ABS) blend. PC-ABS is known to have high tensile strength and excellent heat resistance. These mechanical properties make PC-ABS a preferred choice for electrical enclosure covers used in industrial, commercial, or residential environments. However, other materials may be utilized without deviating from the scope of the present invention. At a block 302, the polymer constituents are combined and heated into a liquid composition.

A block 303 represents the heated composition being injected into a mold, forming the unitary cover 204, discussed above. This includes forming the cover 204 with the front wall 222 and peripheral rim 224 and integral cooling structure 240, as described. Alternatively, the cooling structure can be injection molded in a separate step and subsequently secured to the front wall 222 and peripheral rim 224. However, uniform material selection allows for easier manufacturing, since material change and additional injection molding steps can be avoided when producing a single member of uniform composition.

At a block 304, the cover 204 is solidified and ejected from the mold. The cover 204 can be quickly cooled through forced or natural convection after ejection. At a block 305, the cover 204 is fastened to the enclosure 202 using the hinges 234 to form the electrical enclosure assembly 200 in accordance with the invention.

Thus, in accordance with the invention, there is provided an electrical enclosure assembly, and method of manufacturing an electrical enclosure assembly, including integrated cooling structure.

The description and drawings are illustrative only, and are intended as a representation of an embodiment for making and using the invention. It will be apparent to one of ordinary skill in the art that modifications may be made to this embodiment without departing from the spirit and principle of the invention.

We claim:

1. An electrical enclosure assembly comprising: an enclosure having walls defining an interior space for housing electrical components and having a front flange surrounding a front opening; a cover hingedly mounted to the enclosure for selectively closing the front opening, the cover comprising a front wall larger than the front opening and a rearwardly extending peripheral rim and cooling structure integrally formed on an interior surface of said cover proximate said peripheral rim, said cooling structure comprising a partition wall and a plurality of spaced apart cooling ribs between the partition wall and the peripheral rim, the cooling ribs each having a shoulder engaging the enclosure front flange when the cover is in a closed position to provide an air flow path between said interior space and outside of the enclosure through spaces between the cooling ribs.

2. The electrical enclosure assembly of claim 1, wherein said cooling structure prohibits direct access to said electrical components.

3. The electrical enclosure assembly of claim 1, wherein said cooling ribs extend along opposite sides of the cover.

4. The electrical enclosure assembly of claim 3, wherein said cooling ribs are L shaped to define said shoulder and said peripheral rim extends rearwardly of the front flange.

5. The electrical enclosure assembly of claim 1, wherein said peripheral rim extends around a top edge of the front wall to define a top rim and wherein said electrical enclosure assembly further comprises a protective ledge formed below said top rim.

6. The electrical enclosure assembly of claim 5, further comprising vertical support ribs disposed between said protective ledge and said top rim.

7. The electrical enclosure assembly of claim 1 wherein said cover comprises a unitary structure formed of polymer material.

8. The electrical enclosure assembly of claim 7, wherein said polymer material is a polycarbonate-acrylonitrile butadiene styrene blend.

9. A method for manufacturing an electrical enclosure assembly comprising the steps of: providing an enclosure having walls defining an interior space for housing electrical components and having a front flange surrounding a front opening; forming a cover comprising a front wall larger than the front opening and a rearwardly extending peripheral rim including a top rim and opposite side rims; forming a cooling structure on the interior surface of said cover, said cooling structure comprising a partition wall and a plurality of spaced apart cooling ribs between the partition wall and the peripheral rim, the cooling ribs each having a shoulder; and mounting said cover to said enclosure with said cooling rib shoulders engaging the enclosure front flange when the cover is in a closed position to provide an air flow path between said interior space and outside of the enclosure through spaces between the cooling ribs.

10. The method of claim 9, wherein said cooling structure defines prohibits direct access to said electrical components.

11. The method of claim 9, wherein said cooling ribs extend along opposite sides of the cover.

12. The method of claim 11, wherein said cooling ribs are L shaped to define said shoulder and said peripheral rim extends rearwardly of the front flange.

13. The method of claim 9, further comprising a step of forming a protective ledge below said top rim.

14. The method of claim 13, further comprising a step of forming vertical support ribs disposed between said protective ledge and said top rim.

15. The method of claim 9, further comprising a step of forming said cover from a polycarbonate-acrylonitrile butadiene styrene blend.

\* \* \* \* \*